United States Patent [19]

Binsma et al.

[11] Patent Number: 5,472,907

[45] Date of Patent: Dec. 5, 1995

[54] METHOD OF MANUFACTURING AN OPTOELECTRONIC SEMICONDUCTOR DEVICE

[75] Inventors: Johannes J. M. Binsma; Johannes M. M. Van Der Heijden, both of Eindhoven, Netherlands

[73] Assignee: U.S. Philips Corporation, New York, N.Y.

[21] Appl. No.: 167,386

[22] Filed: Dec. 15, 1993

[30] Foreign Application Priority Data

Dec. 16, 1992 [EP] European Pat. Off. .............. 92203945

[51] Int. Cl.⁶ .................................................. H01L 21/20
[52] U.S. Cl. .................... 437/129; 148/DIG. 95
[58] Field of Search .......................... 437/129, 126, 437/133; 148/DIG. 95

[56] References Cited

U.S. PATENT DOCUMENTS

| 4,820,655 | 4/1989 | Noda et al. | 437/129 |
| 4,922,500 | 5/1990 | Chang-Hasnain et al. | 437/129 |

FOREIGN PATENT DOCUMENTS

| 0411145 | 2/1991 | European Pat. Off. . | |
| 77486 | 5/1985 | Japan | 437/129 |

Primary Examiner—R. Bruce Breneman
Assistant Examiner—Linda J. Fleck
Attorney, Agent, or Firm—Steven R. Biren

[57] ABSTRACT

A method of manufacturing an optoelectronic semiconductor device includes the step of providing two comparatively thin layers next to one another on a substrate by means of a non-selective growing process, an etching process, and a selective growing process, a cladding layer being present over said thin layers. In the known method, first the one thin layer and the cladding layer are grown, the latter is locally removed, and the other thin layer and the cladding layer are then grown in that position. This method has the disadvantage that unevennesses (steps or openings) often arise at the surface of the layer structure above the transition between the thin layers. In the present method, in a first non-selective growing process the one layer and a small portion of the cladding layer are provided, these layers are locally removed in the etching process, and the other thin layer and a small portion of the cladding layer are provided in that location in the selective growing process, after which in a second non-selective growing process the major portion of the cladding layer is provided. The layer structure obtained has a substantially plane surface which is free from defects and is very suitable for further processing. The thin layers may be, inter alia, an active and a radiation-guiding layer. In particular, devices having a mesa structure can be manufactured with a high accuracy and yield.

13 Claims, 6 Drawing Sheets

METHOD OF MANUFACTURING AN OPTOELECTRONIC SEMICONDUCTOR DEVICE

BACKGROUND OF THE INVENTION

The invention relates to a method of manufacturing an optoelectronic semiconductor device with a semiconductor body, whereby a semiconductor layer structure is provided on a semiconductor substrate by means of a non-selective growing process, an etching process and a selective growing process, a first portion of this structure comprising a comparatively thin active layer and a second portion situated adjacent and against the first portion comprising a comparatively thin radiation-guiding layer, while said semiconductor layer structure further comprises a cladding layer situated over the thin layers.

Such a method is highly suitable inter alia for manufacturing diode lasers comprising a waveguide. The waveguide then comprises, for example, a non-absorbing minor region or an extension of the resonance cavity which is provided, for example, with a grating. Other devices having an active element such as a diode laser, a laser amplifier, or a photodiode integrated with a waveguide may also be advantageously manufactured by such a method. In that case, components such as lasers, amplifiers, detectors, waveguides, modulators, switches, etc, may be integrated.

Such a method is known from European Patent Application 90902703.9 published under no. 0 411 145 on Jun. 6, 1991. It is described therein how in this manner a DFB (=Distributed Feed Back) diode laser with an active layer and an optical modulator with a radiation-guiding layer are integrated on a substrate. A 0.15 μm thick InGaAsP (λ=1.55 μm) active layer 4 and a 0.5 μm thick InP cladding layer 5 are provided on an InP substrate 1 (see column 6 and FIGS. 9 to 13 of EP 0 411 145) by means of a non-selective growing process. These layers are locally removed by etching outside a first portion of the layer structure. After this, a second portion of the layer structure situated adjacent and against the first portion is provided here by a selective growing process. The second portion comprises an InGaAsP (λ=1.4 μm) radiation-guiding, —and here also radiation-absorbing—layer 6 and an InP cladding layer 7, which adjoin to the active layer 4 and the cladding layer 5, respectively, in the first portion substantially contiguously.

A disadvantage of the known method is that in this method unevennesses and/or openings can arise in the cladding layer near the surface of and at the area of the transition between the two portions of the layer structure. Such defects cause problems in the implementation of various processes usual in manufacture, such as photolithographic, metallization, deposition or etching processes.

SUMMARY OF THE INVENTION

The invention has for its object to provide a method of the kind mentioned in the opening paragraph whereby optoelectronic semiconductor devices can be obtained whose surfaces are at least substantially plane and free from defects. Further manufacturing steps can be carried out accurately and with a high yield as a result of this. The devices thus manufactured accordingly have a narrow spread in their properties.

According to the invention, a method of the kind mentioned in the opening paragraph is for this purpose characterized in that one of the thin layers and a small portion of the cladding layer are provided in a first non-selective growing process, the layers provided are locally removed in the etching process and the other thin layer and again a small portion of the cladding layer are provided in this area in the selective growing process, and subsequently in a second non-selective growing process the major portion of the cladding layer is provided. The invention is based inter alia on the recognition that an imperfect connection between two layer structures is more likely to arise in a selective growing process for one layer structure next to an existing layer structure in proportion as these structures are thicker. This is connected inter alia with the fact that abnormally high or low growth rates occur in a selective growing process near the transition between the two layer structures. In proportion as the thickness of the layer structure to be grown selectively is greater, accordingly, the absolute value of the difference in thickness in this layer structure close to and remote from the transition increases. This great absolute difference in layer thickness results in defects and unevennesses (openings or steps) in the surfaces of the layer structures near the transition between them. The said differences in growth rate have different causes—partly depending on the growing technique—such as the lateral limitation of the growing layer structure by a crystal phase which is not perpendicular to the thickness direction. Now if one of the thin layers and only a small portion of the cladding layer are grown each time both in a first non-selective and in the selective growing process, it is achieved owing to the comparatively small total thickness of the layers grown up to that point that these layers merge well into one another seen in absolute terms and the surface near the transition is comparatively plane and free from defects. Since the growth is then continued with a second non-selective growing process, in which the major portion of the cladding layer is provided, the plane and defect-free surface is conserved. In fact, the comparatively small unevennesses in the surface near the transition are even reduced in the latter process. Such a planarizing effect occurs especially when LPE (=Liquid Phase Epitaxy) is used for this process, but also when MOVPE (=Metal Organic Vapour Phase Epitaxy) is used, such an improvement in planeness will occur. Thanks to the method according to the invention, furthermore, it is achieved that the active layer and the radiation-guiding layer are no longer exposed to air or water after being grown, when the structure is removed from the growing reactor, because they are covered then with a (small) portion of the cladding layer. Such an exposure may result in serious degradation of the optoelectronic properties, which is obviously highly undesirable. It is noted that an intermediate removal from the reactor is necessary for providing a mask and for etching away part of the layer structure. A very important advantage of the method according to the invention, finally, is that a very good optical connection is obtained thereby between the active and the radiation-guiding layers.

In a first embodiment of a method according to the invention, at most one quarter of the cladding layer is provided in the first non-selective and the selective growing process, and at least three quarters of the cladding layer are provided in the second non-selective growing process. In the known method, a cladding layer of approximately 0.5 μm is provided. In practice, a thickness of approximately 1 μm is often used. One quarter of the cladding layer accordingly, corresponds to 0.12 to 0.25 μm. An active or radiation-guiding layer normally has a thickness of approximately 0.15 μm. The package grown in the first growing processes according to the invention thus preferably has a thickness of approximately 0.27 to 0.40 μm. The remaining portion of the cladding layer then is substantially thicker, i.e. approximately 0.38 to 0.75 μm thick, whereby major improvements are already obtained. Preferably, at most one tenth of the cladding layer is provided in the first growing processes, corresponding to a thickness of approximately 0.05 to 0.1 μm. On the one hand, this thickness is still amply sufficient for an effective screening of the layer below the cladding layer, and on the other hand the maximum advantages of the invention are substantially obtained thereby. In fact, the thickness yet to be grown is determined by the thickness of the active or radiation-guiding layer in the case of even smaller ratios. In the first non-selective and in the selective growing process, other comparatively thin layers, such as thin etching stopper layers and/or further radiation-guiding layers, may be provided besides an active or radiation-guiding layer without detracting from the advantages of the method according to the invention. Preferably, according to the invention, the thickness of the total layer package provided in the selective growing process is so chosen that this package is coplanar with the layer package provided in the first non-selective growing process. In practice this will often be done in that equal thicknesses are chosen for the various packages. When the thickness desired for the package to be selectively provided is so great that this is no longer possible, a depression may be etched in the area where the latter package is to be provided before this package is provided.

In an important preferred embodiment of the method according to the invention, a strip-shaped mesa is formed in the semiconductor layer structure by means of etching after the second non-selective growing process, the longitudinal direction of this mesa being substantially perpendicular to the transition between the first and the second portion of the semiconductor layer structure, while this mesa extends in both portions of the semiconductor layer structure and comprises a portion of the cladding layer. Such mesa-shaped strips are used, for example, in the manufacture of diode lasers or waveguides of the so-called ridge waveguide type or of the buried hetero type. The method according to the invention has particularly great advantages in the manufacture of devices of the former type. This is because often a mesa is etched into the cladding layer in that case, whereby a major portion of this layer is removed and a comparatively small portion is kept intact. Thanks to the method according to the invention, the thickness of this small portion can be set accurately and with a high homogeneity over a large number of devices on one substrate. An etching stopper layer is often used for etching of a mesa. An important advantage of the method according to the invention is that, when such a layer is provided in (at the start of) the second non-selective growing process, such a layer contains no interruption at the area of the transition between the active and the radiation-guiding layer. In the known method, such an etching stopper layer must be provided in two portions, so that an accurate transition between the two portions is not possible and the layer cannot act (satisfactorily) as an etching stopper at the area of the said transition. Major advantages such as a plane structure free from defects and a good optical connection between the active and radiation-guiding layers, however, are obtained in the manufacture of devices of both types.

In a further embodiment, a further layer structure, preferably a current-blocking layer structure, is provided on either side of the mesa-shaped structure in a further selective growing process, and at least a contact layer is provided in the second non-selective growing process or in a further non-selective growing process. In this manner, for example, a diode laser is manufactured with a SIPBH (=Semi-Insulating Planar Buried Hetero) or a DCPBH (=Double Channel Planar Buried Hetero) structure. In the latter structure, the further non-selective growing process often is the final part of the second non-selective growing process, wherein not only a contact layer but also a portion of the cladding layer is provided.

In a major embodiment of a method according to the invention, the cladding layer and the contact layer provided thereon are not purposely doped while being provided. This has the very important advantage that the radiation losses in the radiation-guiding layer are low, for example, 1 dB/cm. A Zn-doped cladding layer results in losses of approximately 10 dB/cm. According to the invention, a dopant is locally provided in the contact layer and in the cladding layer wherever this is necessary. A Zn dopant is especially suitable for this. In that case, an n-type substrate is used with possibly an overlying n-type epitaxial layer on which the active and radiation-guiding layers are provided. An n-type doped layer or substrate substantially does not contribute to the said loss of 1 dB/cm. If so desired, the substrate and an epitaxial layer provided thereon may also be doped only locally.

A very favorable embodiment of a method according to the invention is characterized in that in the second portion of the semiconductor layer structure a strip-shaped mesa is formed in which a dopant is provided over half the width thereof in the cladding layer and the contact layer and which, seen from above, branches out at either end into two further strip-shaped mesas, one of the two further strip-shaped mesas which merge into the non-doped portion of the strip-shaped mesa being formed in the first portion of the layer structure and the remaining mesas in the second portion thereof, while a riopant is provided in the cladding layer and the contact layer of the one further mesa. A device is obtained by such a method which comprises a so-called TIR (=Total Internal Reflection) switch and an amplifier (integral therewith). This device is thus obtained in a simple manner and with a high yield and has very favourable properties, such as very low-loss waveguides, thanks to the local doping of the cladding layer and the contact layer.

Preferably, in a method according to the invention, n-type InP is chosen as the material of the substrate and the further cladding layer, InGaAsP ($\lambda=1.5$ μm) for the material of the active layer, InGaAsP ($\lambda=1.3$ μm) for the material of the radiation-guiding layer, p-type InP for the material of the cladding layer, p-type InGaAs(P) for the material of a contact layer, and n-type InP and p-type InP are chosen for the material of a current-blocking layer structure situated adjacent the mesa-shaped strip, Zn is used as the p-type dopant, and the semiconductor body is provided with two mirror surfaces which are mutually parallel, which extend perpendicular to the longitudinal direction of the mesa-shaped strip, and between which the first and the second portion of the layer structure are present, by means of cleaving. Devices are obtained in this manner which comprise, for example, a diode laser or laser amplifier integrated with a waveguide and which are suitable for use in optoelectronic applications such as optical glass fibre communication systems.

BRIEF DESCRIPTION OF THE INVENTION

The invention will now be described with reference to several embodiments and the drawing, in which FIG. 1 diagrammatically shows a semiconductor diode laser, partly in perspective view and partly in cross-section, manufactured by a first embodiment of a method according to the invention, FIG. 2 diagrammatically shows the semiconductor diode laser of FIG. 1 in cross-section taken on the line II—II, FIGS. 3 to 8 show the semiconductor diode laser of FIG. 1 in consecutive stages of manufacture by a first embodiment of a method according to the invention, FIGS. 3 to 6 being cross-sections taken on the line II—II and FIGS. 7 and 8 being cross-sections taken on the line VII—VII in FIG. 1, FIG. 9 diagrammatically shows a semiconductor diode laser amplifier integrated with a switch in perspective view, manufactured by means of a second embodiment of a method according to the invention, FIGS. 10 and 11 diagrammatically show the device of FIG. 9 in cross-section taken on the lines X—X and XI—XI, and FIGS. 12 to 17 show the device of FIG. 9 in consecutive stages of manufacture by a second embodiment of a method according to the invention, and in cross-section taken on the line X—X in FIG. 9.

DESCRIPTION OF THE PREFERRED EMBODIMENTS

Figure 1:
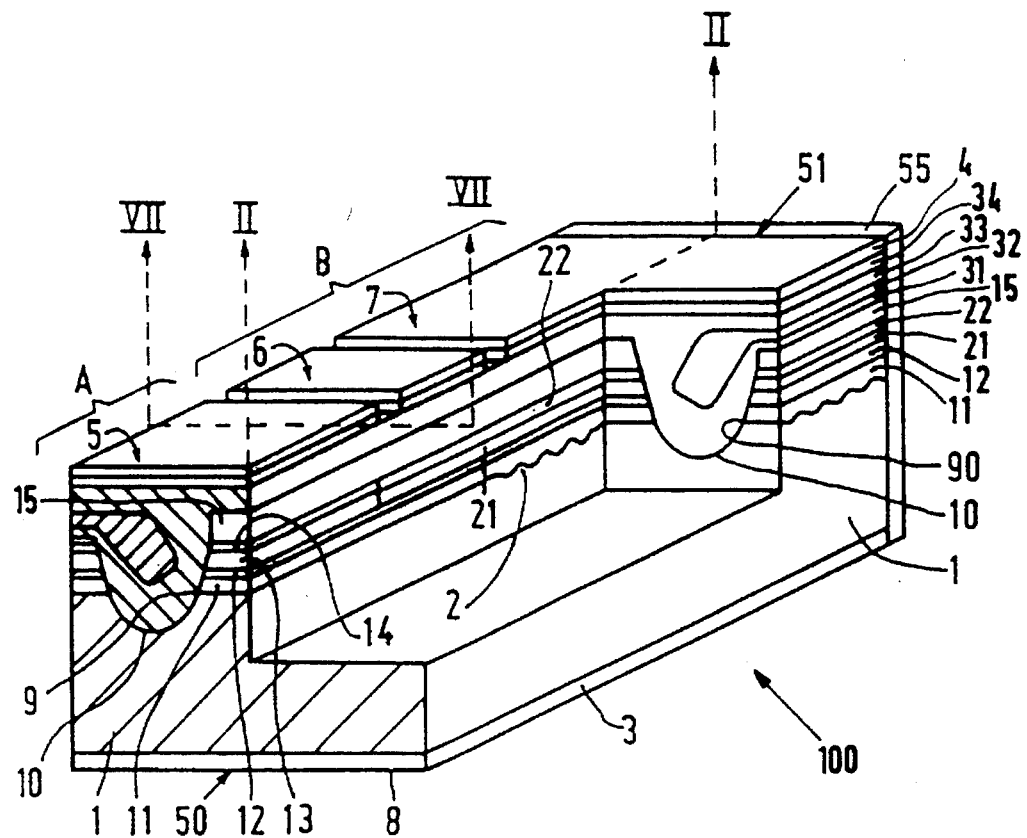
Figure 2:
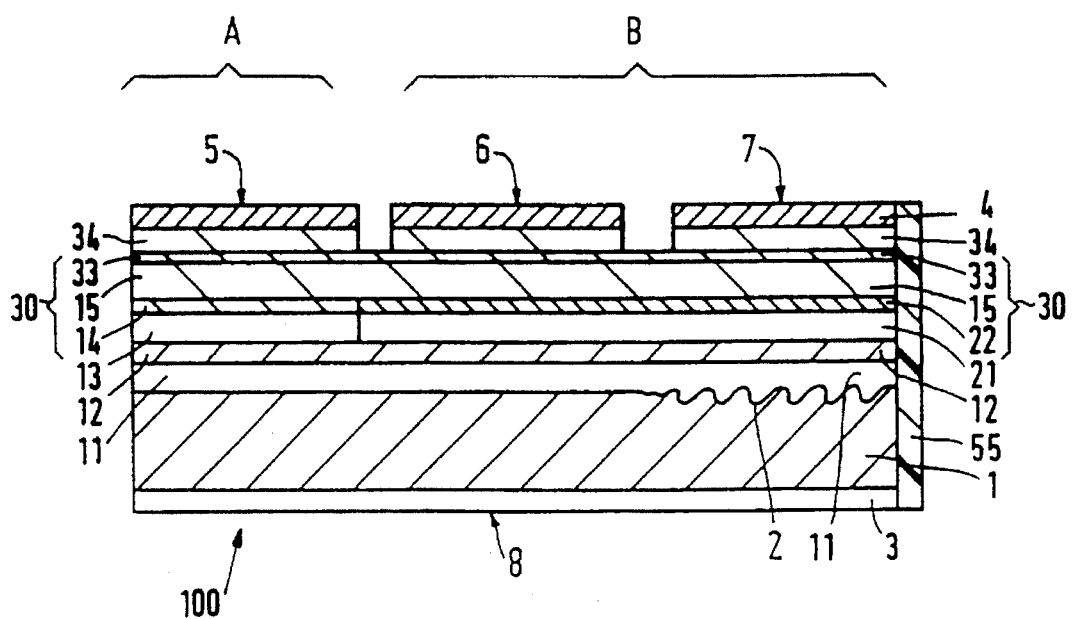
Figure 3:
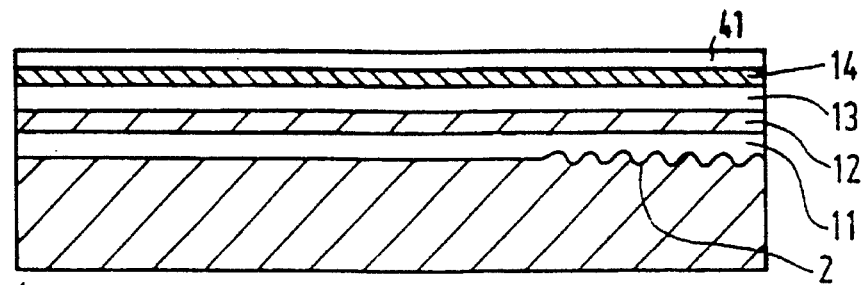
Figure 4:
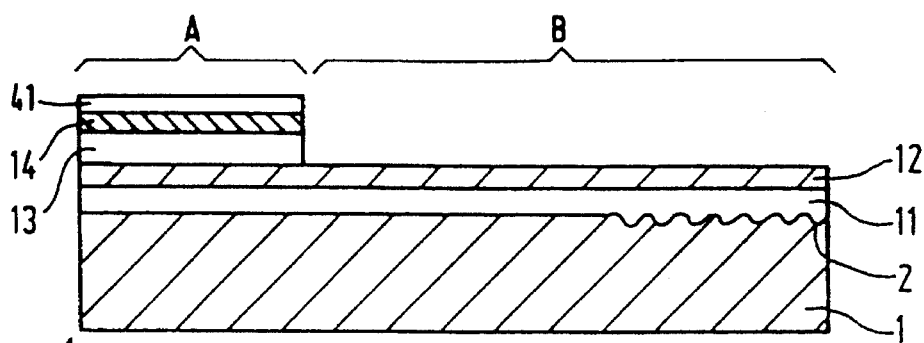
Figure 5:
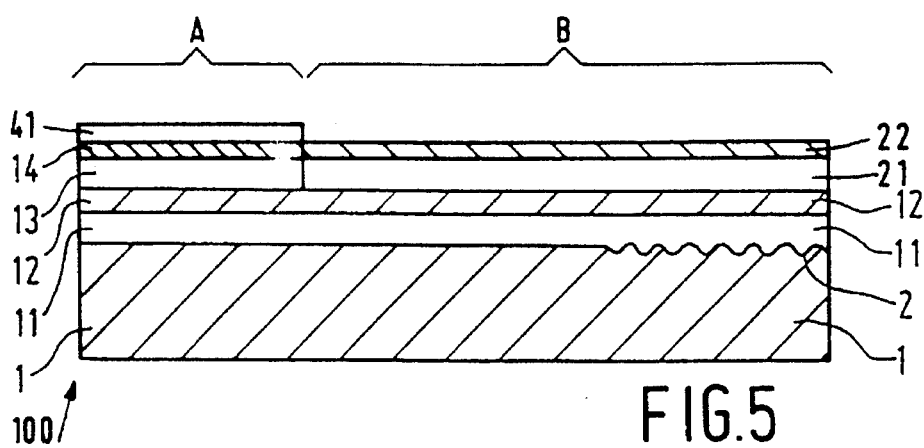
Figure 6:
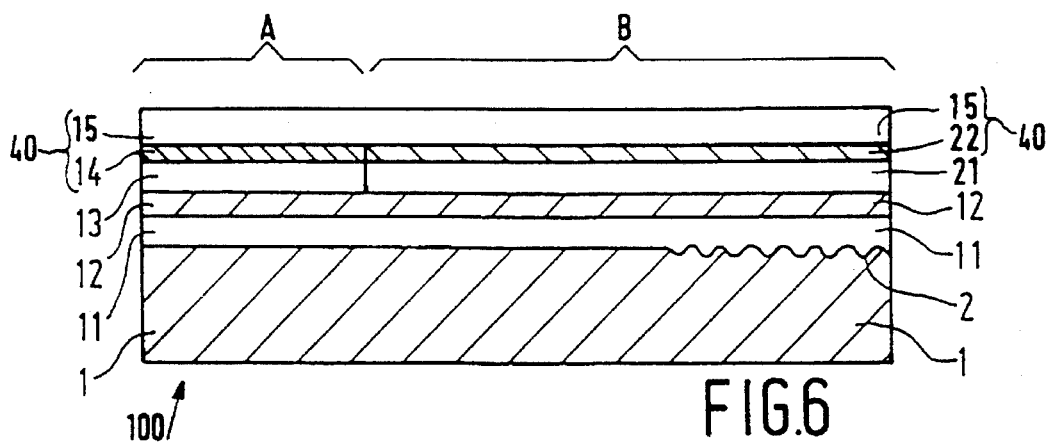

FIG. 1 diagrammatically shows a semiconductor diode laser, partly in perspective view and partly in cross-section, manufactured by a first embodiment of a method according to the invention. A diagrammatic cross-section of the semiconductor diode laser of FIG. 1 taken on the line II—II is shown in FIG. 2. The semiconductor diode laser (see FIG. 1) comprises a semiconductor body 100 with a substrate 1 of a first, here the n-conductivity type provided with a metal layer 3 and a connection conductor 8, while a grating 2 is present locally within a portion B of a layer structure. The layer structure comprises inter alia the following regions: on the one hand a strip-shaped mesa 9 and on the other hand two regions 90 situated outside grooves 10, which regions are all subdivided into three sections at an upper side on which connection conductors 5, 6 and 7 are arranged. The layer structure here comprises a comparatively thin active layer 13 which is present within a portion A only, and an also comparatively thin radiation-guiding layer 21 which is present only within the portion B of the layer structure adjoining the first portion A. Furthermore, there is a first cladding layer 30, here of the p-conductivity type, which extends over the comparatively thin layers 13, 21, and on top of that, divided into three sections, a contact layer 34, here also of the p-conductivity type, and a metal layer 4. The layer structure further comprises a further radiation-guiding layer 11, a second cladding layer 31, here of the p-conductivity type, a third cladding layer 32, here of the n-conductivity type, a fourth cladding layer 33, here of the p-conductivity type and further cladding layers 12, 1, here of the n-conductivity type. The diode laser can be operated and continuously attuned as to wavelength by means of the connection conductors 5, 6, 7, 8. Between the layers 12 and 30 there is in the layer structure a pn junction which, given a sufficient current strength in the forward direction at least at the area of portion A, is capable of generating coherent electromagnetic radiation in the active layer 13. The cladding layers 1, 12, 30 each have a smaller refractive index for the laser radiation generated than does the active layer 13, and have a wider bandgap than the active layer 13. The radiation generated can propagate from the active layer 13 in the radiation-guiding layers 11, 21 which have a refractive index and bandgap which lie between those of the active layer 13 and the cladding layers 1, 12, 30, because the thickness of portion 12 of the further cladding layer is such that the further radiation-guiding layer 11 lies within the amplification profile of the active layer 13 and the radiation-guiding layer 21. Within the mesa 9, the active layer 13 and the radiation-guiding layers 11 and 21 form a strip-shaped resonance cavity which is bounded on two sides by two flanks of the mesa-shaped portion, and on two other sides by two end faces 50 and 51 which are substantially perpendicular to the active layer 13, one of these (the end face 51) being provided with an anti-reflection coating 55 which serves inter alia for preventing as much as possible that competition arises between the Bragg reflection at the grating 2 and a reflection at the mirror surface 5 I. The radiation emerging at the end face 50 is available for use. This radiation is guided, for example, into a glass fibre in the case of optical glass fibre communication. The laser according to the present example is of the DCPBH type mentioned above and comprises a current-blocking layer structure in the grooves 10 outside the mesa 9, which structure comprises a second cladding layer 31, here of the p-conductivity type, a third cladding layer 32, here of the n-conductivity type, and a fourth cladding layer 33, here of the p-conductivity type, the layers 31 and 33 being connected to and merging into the first cladding layer 30 near the edge of the mesa 9. In this example, the substrate 1, the further cladding layer 1, 12, and the current-blocking layer 32 comprise n-InP. The cladding layer 30 and the current-blocking layers 31 and 33 comprise p-InP. Note that in the InP/InGaAsP material system of this embodiment, the substrate 1, comprising InP, also functions as a cladding layer. The other layers comprise indium-gallium-arsenic-phosphorus ($In_xGa_{1-x}As_yP_{1-y}$). The values of (x, y) for the radiation-guiding layers 11 and 21 and the contact layer 34 are: x=0.72 and y=0.60, and for the active layer 13: x=0.57 and y=0.91. The remaining layers are not purposely doped.

Figure 7:
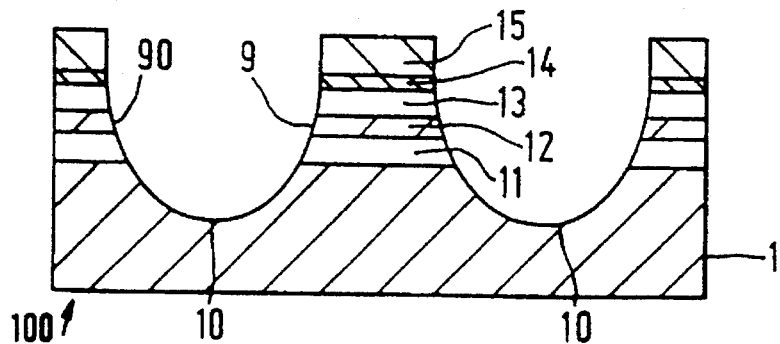
Figure 8:
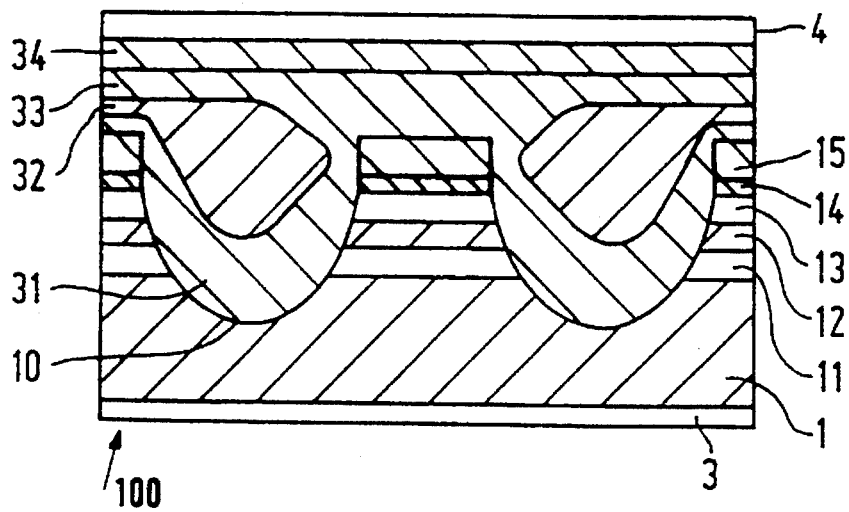

The semiconductor diode laser described is manufactured as follows in a first embodiment of a method according to the invention, see FIGS. 3 to 8, in which FIGS. 3 to 6 are cross-sections taken on the line II—II in FIG. 1 and FIGS. 7 and 8 are cross-sections taken on the line VII—VII in the same Figure. The process starts with a substrate 1 of n-type InP with a thickness of approximately 360 μm, a (100) orientation and a doping concentration of, for example, $5 \times 10^{18}$ atoms per $cm^3$. This substrate may be a single substrate, but it may alternatively be formed by an epitaxial layer grown onto a subjacent carrier body. A diffraction grating 2 is etched into this substrate 1 (see FIG. 3) with a grating constant of approximately 240 nm. For this purpose, a photoresist layer is first provided on the upper surface to a thickness of approximately 100 nm. A raster pattern is formed from this photoresist layer by means of holographic illumination with the use of the 363.8 nm line of an argon laser. This pattern is used as a mask in an etching process in which a pattern 2 of parallel grooves is etched into the upper surface of the substrate, for example, by means of a solution of hydrogen bromide (HBr) and bromine ($Br_2$) in water in a composition of $H_2O:HBr:Br_2$=60:30:1. After removal of the photoresist, an approximately 0.2 μm thick layer 11 with the composition $In_{0.72}Ga_{0.28}As_{0.60}P_{0.40}$ which entirely fills up the grooves 2 in the substrate 1, is provided by a growing technique, in this case MOVPE (=Metal Organic Vapour Phase Epitaxy). Then an approximately 0.1 μm thick layer 12 of InP, which is not purposely doped, is grown thereon.

In a first non-selective growing process according to the invention, a comparatively thin active or radiation-guiding layer is then provided, here an approximately 0.15 μm thick active layer 13 of not purposely doped $In_{0.57}Ga_{0.43}As_{0.91}P_{0.09}$, as well as a small portion 14 of a cladding layer to be formed, here an approximately 0.10 μm thick InP layer 14 with a doping level of $1 \times 10^{18}$ Zn atoms/cm$^3$. After removal from the growing equipment, a masking layer 41 of silicon dioxide (SiO$_2$) is provided, for example, by sputtering. Then the layer 41 (see FIG. 4) is removed in a usual manner at the area of portion B, after which, according to the invention, the layer structure is etched away at the area of portion B, with the remaining portion of the layer 41 serving as a mask, down to the layer 12 which acts as an etching stopper. After cleaning in a usual manner, the obtained structure according to the invention is placed in the growing equipment again and (see FIG. 5) the other comparatively thin layer, here the radiation-guiding layer 21, in this case an approximately 0.15 μm thick layer 21 of not purposely doped $In_{0.72}Ga_{0.28}As_{0.60}P_{0.40}$, and an also small portion 22 of a cladding layer to be formed, here an approximately 0.10 μm thick layer 22 of p-type InP with a doping level of $1 \times 10^{18}$ atoms/cm$^3$ are locally provided in a selective growing process with the layer 41 serving as a mask. The comparatively thin layers 13, 21 and the small portions 14, 22 of a cladding layer to be formed merge comparatively well into one another, according to the invention, and result in a substantially plane surface free from defects of the portion of the layer structure grown thus far. The thicknesses of the layers 21, 22 are so chosen here that the sum of these thicknesses is equal to the sum of the thicknesses of the layers 13, 14. After the obtained structure has been taken from the growing equipment, layer 41 has been removed; and the structure has been cleaned, according to the invention, (see FIG. 6) the major portion 15 of a cladding layer 30 to be formed is provided by means of a second non-selective growing process. The portion 15 here comprises a 1 μm thick layer of p-type InP with a doping concentration of $1 \times 10^{18}$ atoms/cm$^3$. As a result of this, according to the invention, the surface of the layer structure remains comparatively plane and free from defects after the second non-selective growing process. In this example, the portion 14, 22 of the cladding layer 30 to be formed which is provided before the second non-selective growing process amounts to $0.1/(0.1+)=9/100$ of the portion 40 formed thus far of the cladding layer to be provided, which is less than ¼ and even less than 1/10 in this case. The maximum advantages of the method according to the invention are substantially obtained thereby.

After removal from the growing equipment and cleaning, the next step in the present example (see FIG. 7) is to provide a mesa 9 by means of photoresist, photolithography, and usual etching means in the form of a strip situated between grooves 10, the longitudinal axis of this mesa being substantially perpendicular to the transition between the portions A and B of the layer structure, while this mesa extends over the two portions A and B and comprises a portion 14, 22, 15 of the cladding layer 30 and here also the active layer 13, the radiation-guiding layer 21 and a portion of a further cladding layer 12, 1, situated below the said layers, as well as in this case also the further radiation-guiding layer 11 (see also FIG. 1). The width of the mesa 9 is approximately 0.9 μm. After removal of the photoresist and cleaning, the structure thus obtained is returned to the growing equipment and a number of semiconductor layers is grown (see FIG. 8). First a p-type InP layer 31 is grown on either side of the mesa 9 with a doping of $8 \times 10^{17}$ Zn atoms per cm$^3$, and on top of that an n-type current-blocking layer 32 of InP with a doping of $8 \times 10^{17}$ Ge atoms per cm$^3$. These layers fill the grooves 10 partly or completely, but they do not grow on the mesa 9. This is connected with the fact that the growing method used here involves growing from the liquid phase, with the geometry of the structure, and with the time in which the layers are grown. The layer 31 touches the edges of layer 15 in the mesa 9. Subsequently, in a further non-selective growing process in the present example, again from the liquid phase, a p-type InP layer 33 with a thickness of, for example, 0.7 μm and a doping concentration of $1 \times 10^{18}$ Zn atoms per cm$^3$, and a p-type contact layer 34 of the composition $In_{0.72}Ga_{0.28}As_{0.60}P_{0.40}$, a thickness of 0.5 μm and a doping concentration of $1 \times 10^{19}$ Zn atoms per cm$^3$ are grown. Layer 33 fluently merges into the layer 15 (see also FIG. 1) above the mesa-shaped region 9. As is evident from this example, the manufacture of the portion 15, 31 of the cladding layer 30 which is provided in the second non-selective growing process can take place advantageously in several steps, whereby the second non-selective growing process in fact comprises two non-selective growing processes. In this example, the portion 14,22 of the first cladding layer 30 (comprising portion 14,22 and layers 15 and 33) which is provided before the second non-selective growing process, comprising two non-selective growing processes in this example, finally amounts to $0.1/(0.1+1+0.7)=5/100$ of the first cladding layer 30, which is even less than the value of 9/100 mentioned above.

After the structure thus obtained has been taken from the growing equipment, metal layers 4 and 3 of conventional composition are provided in usual manner at the upper and lower side of the semiconductor body 100, so that electrical connections can be provided thereon. If so desired, further current-limiting measures may be taken before the metal layer 4 is provided. Thus it is possible to carry out a zinc diffusion into the surface locally above the mesa-shaped portion 9, or an implantation with H$^+$ ions may be carried out outside this portion whereby the semiconductor body (100) is given a high ohmic value at the area of this implantation. Then two grooves are etched into the upper side of the semiconductor body 100 (see FIG. 2) by photolithography and (selective) etching so that three sections are formed which can be provided with separate current conductors 5, 6 and 7. Finally, an anti-reflection coating 55 is provided on one of the lateral faces of the semiconductor body 100, for example by means of sputtering or vapour deposition. The electromagnetic radiation emerging at lateral face 50 (see FIG. 1) may be guided into a glass fibre.

Figure 9:
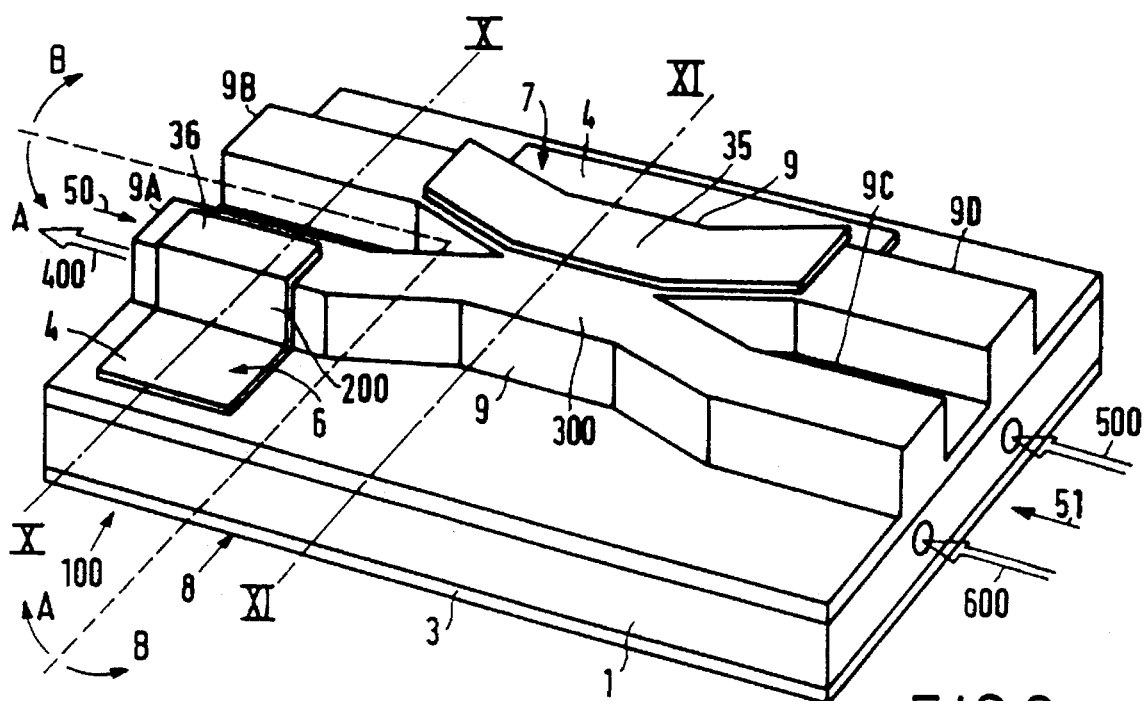
Figure 10:
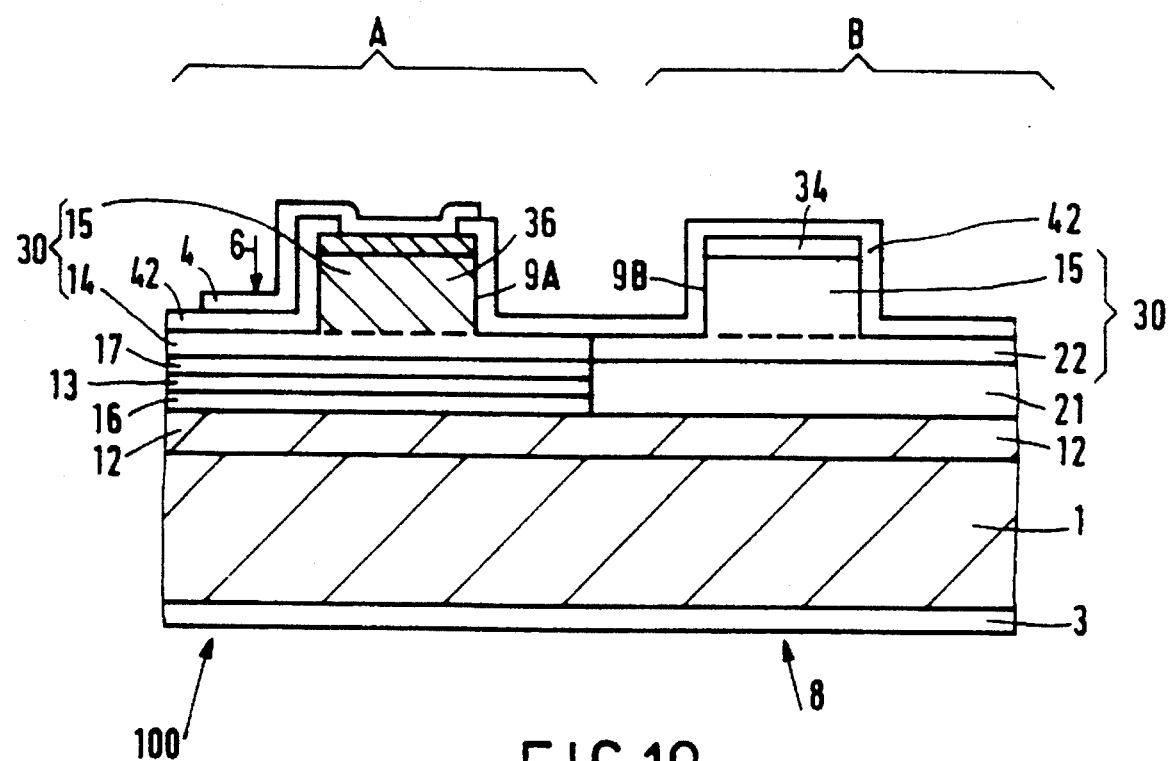
Figure 11:
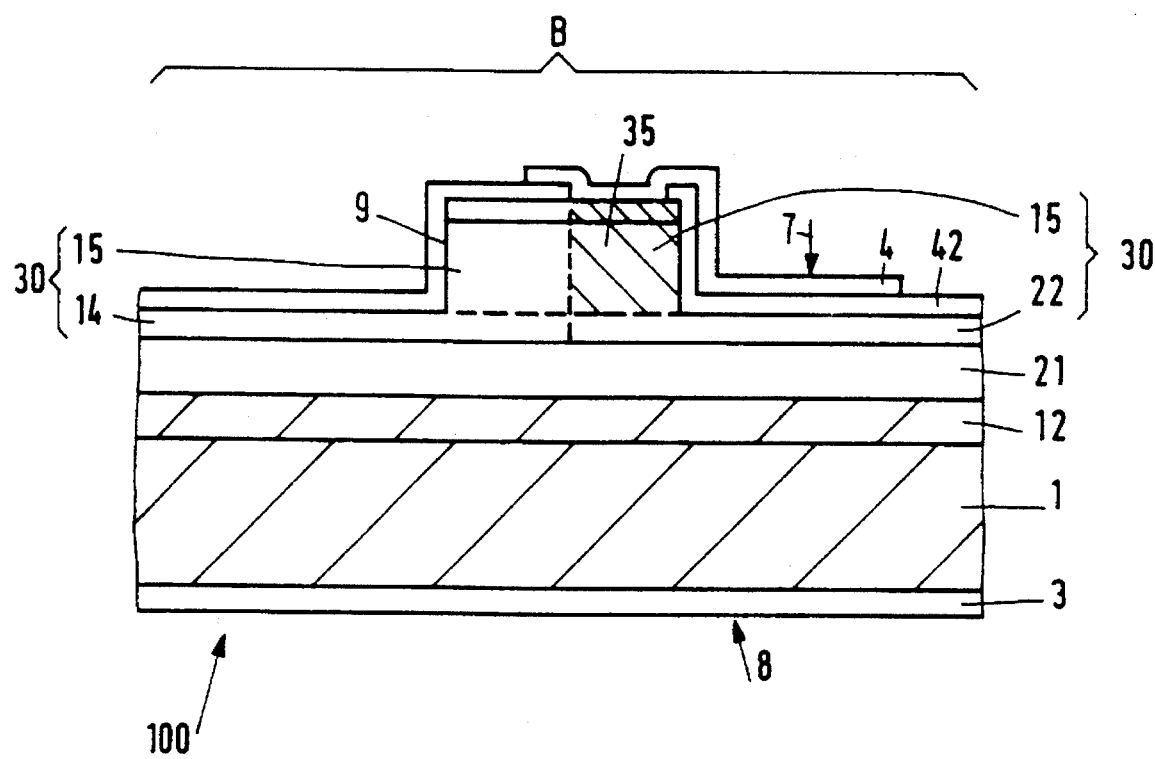

FIG. 9 is a diagrammatic perspective view of a semiconductor diode laser amplifier integrated with a waveguide switch manufactured by a second embodiment of a method according to the invention. A diagrammatic cross-section of the device of FIG. 9 taken on the lines X—X and X1—X1 is given in FIG. 10 and 11, respectively. The amplifier with switch (see FIGS. 9, 10 and 11) comprises a semiconductor body 100 with a substrate 1 of a first, here the n-conductivity type, provided with a metal layer 3 and a connection conductor 8 and with a layer structure in which a laser amplifier 200 is present within a portion A and an X-shaped switch 300 is present within a portion B which lies adjacent and against portion A, both of the RW (=Ridge Waveguide) type. The layer structure comprises a strip-shaped mesa 9 in which a dopant 35, here a local Zn diffusion, was provided over half the width thereof, and which branches out at either end, seen in plan view, into two further strip-shaped mesas 9A, 9B, here forming the switch 300 and 9C, 9D, wherein one (9A) of the two further mesas 9A, 9B adjoining the non-doped portion of the mesa 9 lies in portion A and the remaining mesas 9B, 9C, 9D lie in the portion B, while a dopant 36, here a Zn diffusion, is provided in the cladding layer 30 and a contact layer 34 of the one further mesa 9A, which here forms the amplifier 200. At the areas of the Zn-doped regions 35, 36, there is a metal layer 4 provided with connection conductors 6, 7. One of the radiation beams 500, 600 entering the radiation-guiding layer 21 of the device 100 via mirror surface 51 is switched into the active layer 13 below the further mesa 9A by a switch 300, as selected, and then issues from the device 100 as a radiation beam 400. When the switch 300 is off, i.e. when no current flows through a pn junction situated between the connection conductors 7, 8, the radiation beam 600 continues below the further mesa 9C to the further mesa 9B, and the radiation beam 500 continues below the further mesa 9D to the further mesa 9A. When a current does flow through the connection conductors 7, 8 of the switch 300, the latter is on and a mirror surface is formed as it were at the area of the doped region 35, against which the entering radiation beams 500, 600 are reflected. Radiation beam 600 is then guided to the exit of the device 100, i.e. to the further mesa 9A. In the further mesa 9A, there is a laser amplifier 200 with a pn junction between connection conductors 6, 8. The selected radiation beam 500, 600, which was attenuated in the switch 300, is amplified again in the amplifier 200. The layer structure in which the amplifier 200 and switch 300 are formed here comprises a further cladding layer 12, here also a buffer layer, which in this case is of the n-conductivity type and comprises a comparatively thin active layer 13 situated between two also comparatively thin radiation-guiding layers 16, 17 and present within the portion A only, as well as a comparatively thin radiation-guiding layer 21 which is present within the portion B only of the layer structure. The layer structure further comprises a cladding layer 30 which extends over the comparatively thin layers 16, 13, 17 and 21, and on top of that a contact layer 34, here also at the areas of the doped regions 35, 36 of the p-conductivity type, and a metal layer 4 which is connected to the contact layer 34 above the doped regions 35, 36 and which is for the remaining part insulated from the layer structure by means of an insulating layer 42, here of silicon nitride. The strip-shaped mesas 9, 9A, 9B, 9C, 9D here comprise the contact layer 34 and a major portion 15 of the cladding layer 30. Preferably, the device 100 of FIG. 9 comprises a number, for example, four other mesas (not shown) which lie between the further mesas 9A, 9B and 9C, 9D and, seen in the plane of the drawing, in front of and behind the switch 300. The device 100 becomes substantially planar as a result of such other mesas. Among the advantages of this are that the mirror surfaces 50, 51 are free from defects, that the mesa 9 and the further strip-shaped mesas 9A, 9B, 9C, 9D are protected, and that the device 100 may readily be given a so-called upside-down final mounting. The mirror surfaces 50, 51 are provided with an anti-reflection coating which is not shown in the drawing.

When the device is used in an optical glass fibre communication system, a glass fibre will be present at the areas of the radiation beams 400, 500, 600, which is not shown in the drawing. In the present example, the substrate 1, the further cladding layer 12 and the current-blocking layer comprise n-type InP. The cladding layer 30 comprises InP. The other layers comprise $In_xGa_{1-x}As_yP_{1-y}$. The values of (x, y) are for the radiation-guiding layers 16, 17 and 21 and for the contact layer 34: x=0.72 and y =0.60, and for the active layer 13: x=0.57 and y=0.91.

Figure 12:
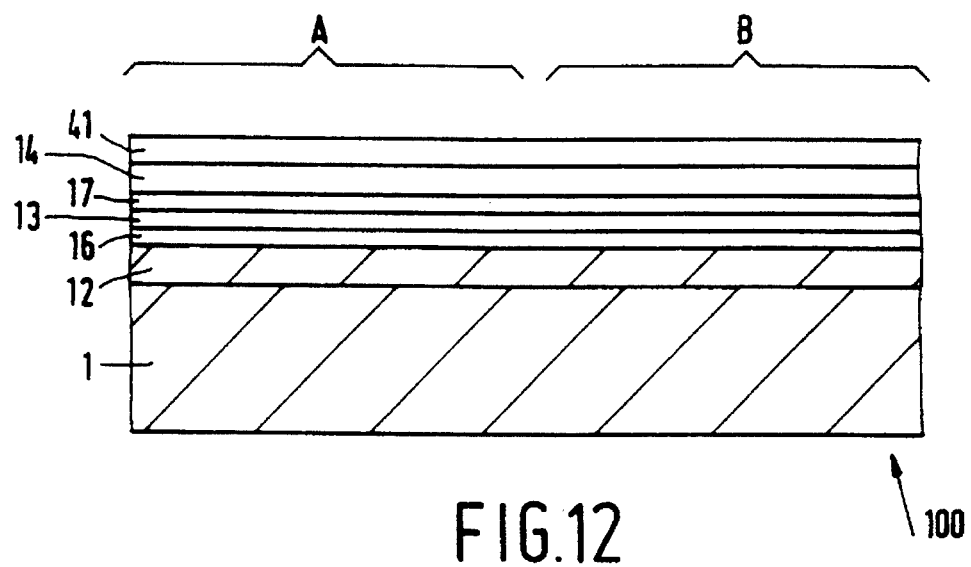
Figure 13:
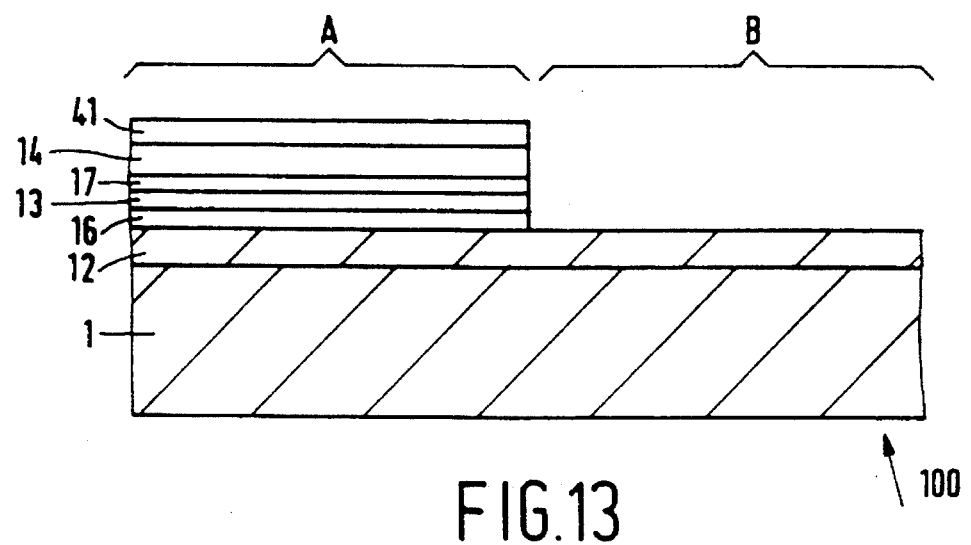
Figure 14:
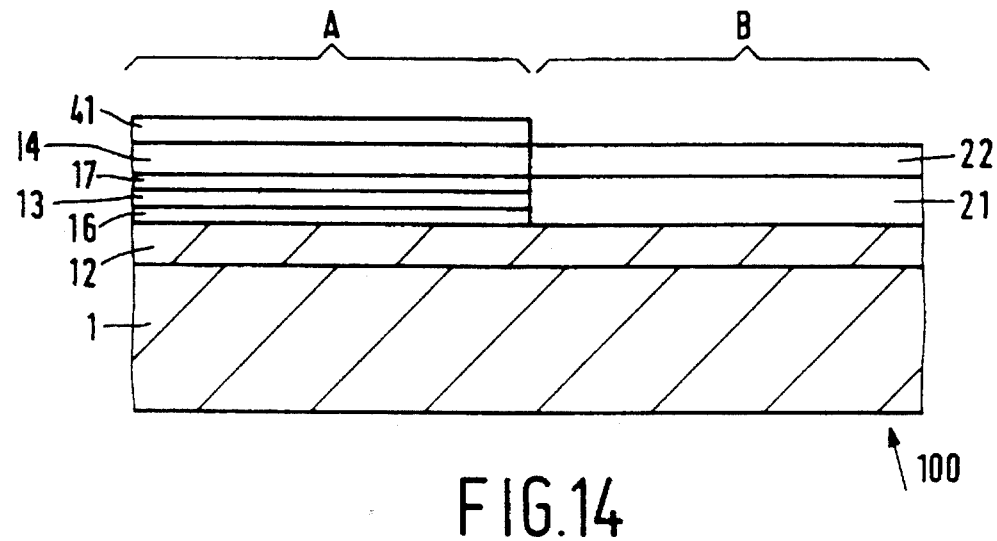
Figure 15:
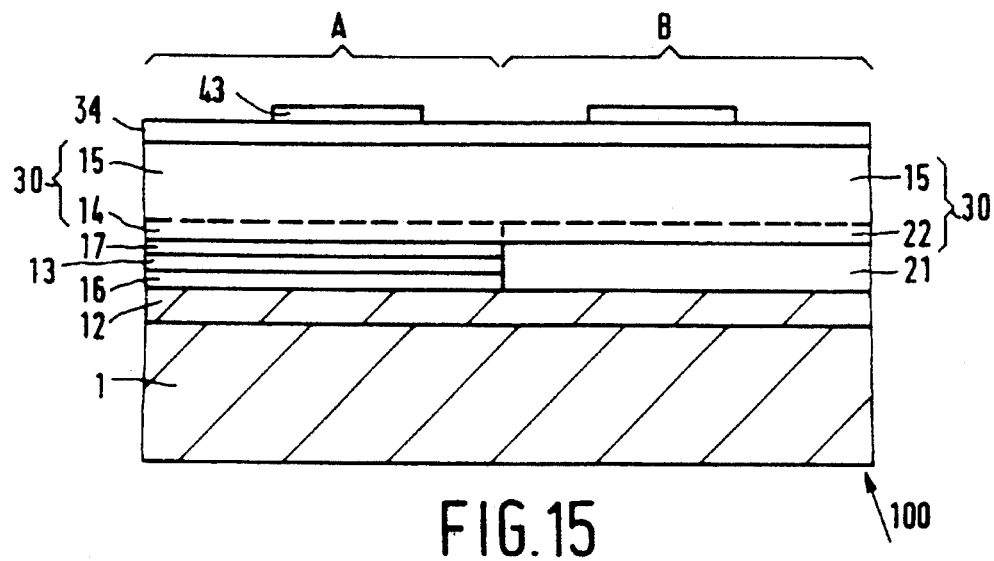

The semiconductor diode laser amplifier/switch described is manufactured as follows by a first embodiment of a method according to the invention. See FIGS. 12–17, which are cross-sections taken on the line X—X in FIG. 9. Manufacture starts with a substrate 1 of n-type InP with a thickness of approximately 360 μm, a (100) orientation and a doping concentration of, for example, $5 \times 10^{18}$ at/cm$^3$. A further cladding layer 12, at the same time buffer layer, of n-type InP with a thickness of approximately 1 μm and a doping concentration of approximately $5 \times 10^{18}$ at/cm$^3$ is provided on this substrate by means of MOVPE (see FIG. 12).

According to the invention, and in a first non-selective growing process, the following semiconductor layers are grown thereon in this case: an approximately 0.04 μm thick radiation-guiding layer 16 with the composition $In_{0.72}Ga_{0.28}As_{0.60}P_{0.40}$, an approximately 0.12 μm thick active layer 13 with the composition $In_{0.57}Ga_{0.28}As_{0.60}P_{0.40}$, an approximately 0.04 μm thick radiation-guiding layer 17 with the composition $In_{0.72}Ga_{0.28}As_{0.91}P_{0.40}$, together forming a comparatively thin, i.e. 0.20 μm thick layer, and an approximately 0.10 μm thick layer 14 of InP which forms a small portion of a cladding layer 30 yet to be formed. After removal from the growing equipment, a masking layer 41 of silicon dioxide (SiO$_2$)) is provided, for example, by means of sputtering. Then the layer 41 (see FIG. 13) is removed in usual manner by etching the area of a portion B, after which according to the invention the layer structure is etched away at the area of portion B and with the remaining portion of the layer 41 serving as a mask down to layer 12, which acts as an etching stopper. After cleaning in a usual manner, the structure obtained according to the invention is returned to the growing equipment and the following layers are provided locally in a selective growing process with the layer 41 serving as a mask (see FIG. 14): the other comparatively thin layer, here comprising the radiation-guiding layer 21, in this case an approximately 0.20 μm thick layer 21 of not purposely doped $In_{0.72}Ga_{0.28}As_{0.60}P_{0.40}$, and an again small portion 22 of a cladding layer to be formed, here an approximately 0.10 μm thick layer 22 of InP, also not purposely doped. The comparatively thin layers 13, 21 and the small portions 14, 22 of a cladding layer to be formed thus merge comparatively well into one another according to the invention and result in a substantially plane surface free from defects of the portion of the layer structure grown thus far. The thicknesses of the layers 21, 22 are so chosen here that the sum of these thicknesses is equal to the sum of the thicknesses of the layers 16, 13, 17 and 14.

After the structure thus obtained has been taken from the growing equipment, layer 41 has been removed, and the structure has been cleaned, according to the invention (see FIG. 15), the major portion 15 of a cladding layer 30 to be formed is provided by means of a second non-selective growing process, as well as a contact layer 34 of $In_{0.72}Ga_{0.28}As_{0.60}P_{0.40}$ with a thickness of approximately 0.20 μm, also undoped. The portion 15 here comprises a 1 μm thick layer of InP. As a result, according to the invention, the surface of the layer structure remains comparatively plane and free from defects after the second non-selective growing process. In this example, the portion 14, 22 of the cladding layer 30 to be provided, which was provided before the second non-selective growing process, comprises 0.1/1.1=$\%_{100}$ of the portion 40 formed thus far of the envisaged cladding layer 30, which here is less than ¼ and even less than ⅒. The maximum advantages of the method according to the invention are substantially obtained thereby.

Figure 16:
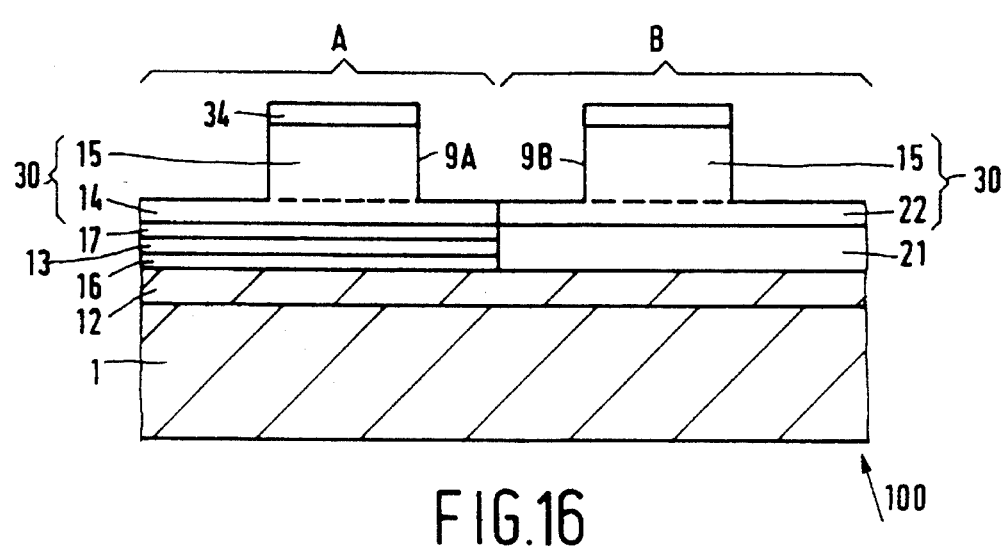
Figure 17:
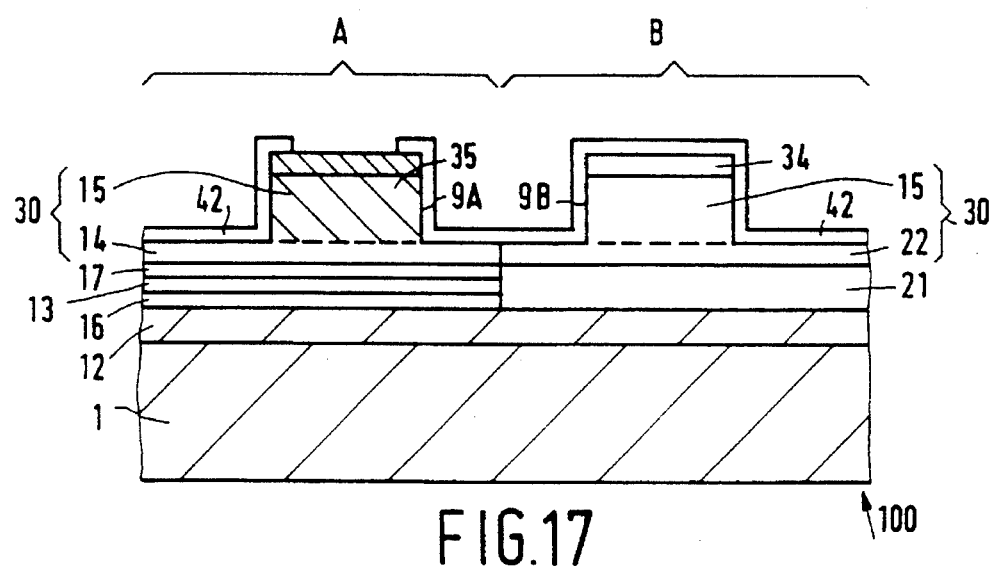

After removal from the growing equipment and cleaning, in this example (see FIG. 16), a strip-shaped mesa 9 and connected further strip-shaped mesas 9A, 9B, 9C, 9D (see also FIG. 9) are formed by means of photoresist 43, photolithography, and usual etchants, here by means of RIE (=Reactive Ion Etching). FIG. 16 shows only the further mesas 9A and 9B. The further mesa 9A is present in portion A of the layer structure, the remaining mesas 9, 9B, 9C, 9D are present in a portion B of the layer structure, and all mesas here comprise in addition to the contact layer 34 a major portion 15 of the cladding layer 30, here an approximately 1 μm thick portion thereof. During the formation of such mesas 9, 9A, 9B, 9C, 9D, which extend over different portions A, B of a layer structure which were provided in different growing processes, the method according to the invention offers major advantages. Such mesas can be manufactured accurately and with a high yield thanks to the comparatively plane and defect-free state of the surface of the layer structure. This is also true when a (thin) etching stopper layer is used during etching, because in that case the degree of through-etching of such an etching stopper layer or the degree of underetching of the cladding layer 30 can be limited.

The portions of the active layer 13 situated between the radiation-guiding layers 16, 17 and of the radiation-guiding layer 21 situated below the mesas 9A and 9B form an active region of the amplifier 200 and a waveguide which forms part of the switch 300, respectively. The width of the mesa 9 is approximately 5 μm, the further mesas 9A, 9B, 9C, 9D are approximately 0.9 μm wide. The total length of the device is approximately 1800 μm, the length of the further mesas 9A, 9B is approximately 500 μm, that of the further mesas 9C, 9D approximately 300 μm, and that of the mesa 9 approximately 80 μm. The length of the gradual transition between the further mesas 9A, 9B, 9C, 9D and the mesa 9 accordingly is approximately (1000–80)2, i.e. approximately 460 μm. The angle within this transition is approximately 3°. The length of the doped region 35 of the switch 300 is approximately 250 μm. The spacing between the further mesas 9A, 9B and 9C, 9D is approximately 30 μm. Subsequently, (see FIG. 17), the manufacture is continued by the application of an approximately 0.3 μm thick layer 42 of silicon nitride in which locally a window is provided above the mesa 9 (not shown in FIG. 17) and above the further mesa 9A, through which a Zn diffusion is carried out whereby the doped regions 35 (not shown in FIG. 17) and 36 are formed.

After this (see FIGS. 10 and 11), a metal layer 4, here made of Pt, Ta, Pt and Au, is provided over the nitride layer 42 and given a certain pattern so as to form regions on which connection conductors 5 and 6 can be provided. Finally, an anti-reflection coating is provided on the mirror surfaces 50, 51 of the semiconductor body 100, for example by means of sputtering or vapour deposition.

The Figures are diagrammatic and not drawn to scale, the dimensions in the thickness direction being particularly exaggerated for the sake of clarity. Corresponding parts are generally given the same reference numerals in the various examples. Semiconductor regions of the same conductivity type are hatched in the same direction as a rule.

The invention is not limited to the embodiments given, since many modifications and variations are possible to those skilled in the art within the scope of the invention. Thus different thicknesses, different semiconductor materials or different compositions from those mentioned in the examples may be used. It is noted in particular that the invention may also be applied to the material systems GaAs/AlGaAs and InGaP/InAlGaP. It is further noted that the invention may be used to great advantage not only in the manufacture of the structures mentioned in the examples, but also for other structures, for example, which do not comprise mesas. An example of an alternative structure comprising a mesa is the SIPBH (=Semi-Insulating Planar Buried Hetero) structure. Examples of alternative structures not containing a mesa are so-called oxide strip or proton bombarded lasers, generally, lasers of the so-called gain guided type. It is finally noted that one or more of the three growing processes forming part of the method according to the invention may employ growing techniques other than MOVPE, such as the LPE technique already mentioned, VPE (=Vapour Phase Epitaxy) and MBE (=Molecular Beam Epitaxy).

We claim:

1. A method of manufacturing an optoelectronic semiconductor device with a semiconductor body (100), whereby a semiconductor layer structure is provided on a semiconductor substrate (1) by means of a non-selective growing process, an etching process and a selective growing process, a first portion (A) of this structure comprising a thin active layer (13) and a second portion (B) situated adjacent and against the first portion (A) comprising a thin radiation-guiding layer (21), said semiconductor layer structure further comprising a first cladding layer (30) situated over the thin active and radiation-guiding layers (13,21), characterized in that a first of the thin layers (13) and a minor portion (14) of the first cladding layer (30) are provided in a first non-selective growing process, the layers (13, 14) provided are locally removed in the etching process, and a second of the thin layers (21) and a further minor portion (22) of the first cladding layer (30) are provided in this area in the selective growing process, and subsequently in a second non-selective growing process a major portion (15,33) of the first cladding layer is provided.

2. A method as claimed in claim 1, characterized in that at most one quarter of the first cladding layer (30) is provided in the first non-selective and the selective growing process, and at least three quarters of the first cladding layer (30) is provided in the second non-selective growing process.

3. A method as claimed in claim 1, characterized in that at most one tenth of the first cladding layer (30) is provided in the first non-selective and the selective growing process, and at least nine tenths of the first cladding layer (30) is provided in the second non-selective growing process.

4. A method as claimed in claim 1, characterized in that a thickness of a total layer thickness of a portion (21, 22) of the semiconductor layer structure provided in the selective growing process is so chosen that this portion is substantially coplanar a the portion (13, 14) of the semiconductor layer structure provided in the first non-selective growing process.

5. A method as claimed in claim 1, characterized in that a strip-shaped mesa (9) is formed in the semiconductor layer structure by means of etching after the second non-selective growing process, the longitudinal direction of this mesa being substantially perpendicular to the transition between the first (A) and the second portion (B) of the semiconductor layer structure, said mesa extending in both portions (A, B) of the semiconductor layer structure and comprising a portion (14, 22, 15) of the first cladding layer (30).

6. A method as claimed in claim 5, characterized in that the strip-shaped mesa (9) is so formed that it comprises a portion (14, 22, 15) of the first cladding layer (30), the thin active layer (13), the radiation-guiding layer (21), and a portion of further cladding layers (12, 1) situated below the active (13) and radiation-guiding layer (21).

7. A method as claimed in claim 5, characterized in that a current-blocking layer structure (31, 32) is provided on either side of the strip-shaped mesa (9) in a further selective growing process, and at least a contact layer (34) is provided in the second non-selective growing process or in a further non-selective growing process.

8. A method as claimed in claim 1, characterized in that the first cladding layer (30) and a contact layer (34) provided thereon are not purposely doped while being provided and are subsequently locally (35) provided with a dopant.

9. A method as claimed in claim 1, characterized in that in the second portion (B) of the semiconductor layer structure a strip-shaped mesa (9) is formed in which a dopant is provided over half (35) a width thereof in the first cladding layer (30) and a contact layer (34) and which, seen from above, branches out at both ends into two further strip-shaped mesas {(9A, 9B), (9C, 9D)}, one (9A) of the two further strip-shaped mesas (9A, 9C) which merge into a non-doped portion of a strip-shaped mesa (9) being formed in the first portion (A) of the semiconductor layer structure and the remaining mesas (9, 9B, 9C, 9D) being formed in the second portion thereof, a dopant being provided in the first cladding layer (30) and a contact layer (34) of the one of the two further strip-shaped mesas (9A).

10. A method as claimed in claim 1, characterized in that at least at an area of the thin active layer (13), a further cladding layer (12) and the substrate (1) are of a first conductivity type, the substrate (1) is provided with a metal layer (3) and a connection conductor (8), the first cladding layer (30) and a contact layer (34) are of a second conductivity type opposite to the first, and the contact layer (34) is also provided with a metal layer (4) and at least one connection conductor (5, 6, 7).

11. A method as claimed in claim 7, characterized in that n-type InP is chosen as the material of the substrate (1) and a further cladding layer (12), InGaAsP for the material of the active layer (13), InGaAsP for the material of the radiation-guiding layer, p-type InP for the material of the first cladding layer (30), p-type InGaAs(P) for the material of a contact layer (34), and p-type InP and n-type InP are chosen for the material of a current-blocking layer structure (31, 32) situated adjacent the strip-shaped masa (9), Zn is used as the p-type dopant, and the semiconductor body (100) is provided with two mirror surfaces (50, 51) which are mutually parallel and extend perpendicular to the longitudinal direction of the strip-shaped mesa (9) and between which the first (A) and the second portion (B) of the semiconductor layer structure are present, by means of cleaving.

12. A method as claimed in claim 1, characterized in that an etching stopper layer is provided in an early stage of the second non-selective growing process.

13. A method as claimed in claim 1, characterized in that the first non-selective and the selective growing process are carried out by means of metal organic vapor phase epitaxy.

* * * * *